United States Patent
Haji-Aghajani et al.

(10) Patent No.: US 7,017,140 B2
(45) Date of Patent: Mar. 21, 2006

(54) COMMON COMPONENTS IN INTERFACE FRAMEWORK FOR DEVELOPING FIELD PROGRAMMABLE BASED APPLICATIONS INDEPENDENT OF TARGET CIRCUIT BOARD

(75) Inventors: Kazem Haji-Aghajani, Amherst, NH (US); Christopher L. Hayes, Hudson, NH (US); Peter Simonson, Greenville, NH (US); Frank Stroili, Hollis, NH (US); Matthew Thiele, Hampstead, NH (US); Robert P. Boland, Wilmington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 328 days.

(21) Appl. No.: 10/303,441

(22) Filed: Nov. 25, 2002

(65) Prior Publication Data
US 2004/0045015 A1    Mar. 4, 2004

Related U.S. Application Data

(60) Provisional application No. 60/407,880, filed on Aug. 29, 2002.

(51) Int. Cl.
*G06F 17/50* (2006.01)
(52) U.S. Cl. .............................. 716/17; 716/16; 716/18
(58) Field of Classification Search .................... 716/1, 716/16, 17, 18; 719/328
See application file for complete search history.

(56) References Cited

U.S. PATENT DOCUMENTS

| | | |
|---|---|---|
| 5,590,156 A | 12/1996 | Carney |
| 5,828,858 A | 10/1998 | Athanas et al. |
| 5,907,697 A | 5/1999 | Barbier et al. |
| 6,047,115 A | 4/2000 | Mohan et al. |
| 6,128,276 A | 10/2000 | Agee |
| 6,182,258 B1 | 1/2001 | Hollander |
| 6,204,687 B1 | 3/2001 | Schultz et al. |
| 6,215,898 B1 | 4/2001 | Woodfill et al. |
| 6,216,191 B1 | 4/2001 | Britton et al. |
| 6,308,311 B1 | 10/2001 | Carmichael et al. |

(Continued)

FOREIGN PATENT DOCUMENTS

EP    1 187 042 A1    3/2002

(Continued)

OTHER PUBLICATIONS

PCT International Search Report dated Feb. 17, 2004 of International Application No. PCT/US03/27097 filed Aug. 28, 2003.

(Continued)

*Primary Examiner*—Thuan Do
(74) *Attorney, Agent, or Firm*—Maine & Asmus (57) ABSTRACT

A multi-level framework that allows an application to be developed independent of the chip or board, and any dependency is built in as part of the framework of the field programmable device (FPD). A shell configuration called a 'wrapper' has a standard look, feel and form factor that provides the interface between the high density language (HDL) application and a standardized and board independent HDL shell, thus isolating the HDL core. A second wrapper is a board specific HDL shell that interacts with the standardized shell. Any application that has the same look, feel and form factor has a common interface that allows various system boards to communicate, providing a mechanism for creating a HDL application component independent of the hardware. An outer shell binds the system to some board and talks to the application program interface (API) layer and the code layer to the outside world, such as the operating system.

20 Claims, 8 Drawing Sheets

U.S. PATENT DOCUMENTS

| | | |
|---|---|---|
| 6,311,321 B1 | 10/2001 | Agnihotri et al. |
| 6,326,806 B1 | 12/2001 | Fallside et al. |
| 6,347,395 B1 | 2/2002 | Payne et al. |
| 6,351,778 B1 | 2/2002 | Orton et al. |
| 6,353,915 B1 | 3/2002 | Deal et al. |
| 6,377,912 B1 | 4/2002 | Sample et al. |
| 6,418,494 B1 | 7/2002 | Shatas et al. |
| 6,691,301 B1 * | 2/2004 | Bowen .................. 716/16 |
| 2002/0008540 A1 | 1/2002 | Britton et al. ............ 326/40 |

FOREIGN PATENT DOCUMENTS

| | | |
|---|---|---|
| WO | WO 01/45258 A2 | 6/2001 |
| WO | WO 02/05444 A2 | 1/2002 |
| WO | WO 02/056481 A2 | 7/2002 |

OTHER PUBLICATIONS

Armstrong et al., *Toward A Common Component Architecture For High-Performance Scientific Computing, Proceedings Of The 1999 Conference On Distributed Computing*, 1999 (reprinted from web site, Nov. 11, 2002), pp. 1-17.

*The Pipelined Frequency Transform, RF Engines Ltd. White Paper*, Feb. 20, 2002, pp 1-14, ref No. PFT001.Rev2.

Myers et al., *Rapid Developement of Signal Processors and the RASSP Program*, Apr. 20, 1994, pp. 1-8.

Gardner et al., *An Object-Oriented Layered Approach to Interfaces for Hardware/Software Codesign of Embedded Systems, Proceedings of the 31$^{st}$ Hawai'i International Conference On System Sciences*, 1998, pp 197-206, vol. VII, IEEE, Kona, Hawaii.

Spivey et al., *A Component Architecture for FPGA- Based, DSP System Design, Proceedings of the International Conference on Application Specific Systems, Architectures, and Processors*, Jul. 2002, San José, California.

Saul, *Hardware Codesign for FPGA-Based Systems, Proceedings Of The 32$^{nd}$ Hawai'i International Conference On System Sciences*, 1999, pp 1-10, IEEE.

*From Algorithm to Hardware—The Great Tools Disconnect, COTS Journal*, Oct. 2001, pp. 48-63.

Lim, et al., *Two Flows for Partial Reconfiguration: Module Based or Small Bit Manipulations*, XILINX XAPP290(v1.0), May 17, 2002, pp. 1-23.

Haji, et al. *A Reconfigurable Computing Platform for Detection and Direction Finding of Frequency Hopping Signals.*, pp 1-7.

*Common Component Architecture Forum*, CCA Forum, 2002. pp. 1-41.

\* cited by examiner

COMMON COMPONENTS IN INTERFACE FRAMEWORK FOR DEVELOPING FIELD PROGRAMMABLE BASED APPLICATIONS INDEPENDENT OF TARGET CIRCUIT BOARD

RELATED APPLICATIONS

This application claims the benefit of U.S. Provisional Applications No. 60/407,880, filed Aug. 29, 2002.

FIELD OF THE INVENTION

The present invention relates to reusable software, and more particularly to multi-level framework that allows a core application to be developed independent of the chip or board and dependency is built in as part of the framework.

BACKGROUND OF THE INVENTION

The rapid evolution of technology has posed significant problems, as well as benefits. Some technologies never achieve their full potential while others evolve rapidly, leaving earlier versions obsolete shortly after they have been installed. Technologies typically need to be substituted or otherwise adapted to compensate for different needs, requiring wholesale redesigns even when the redesign employed similar building blocks. It is well-known that software can be used to allow integration of new hardware or allowing existing hardware to fulfill new functions without starting from scratch.

Large-scale software development has evolved rapidly from its inception. Through the 1980s large-scale software was developed in modular systems of subsystems, and even today these are the most common systems in use. These systems are largely hardware dependent, and problems or errors can be detected down to the level of the subsystem. These systems were based on point solutions where the problem/solution is functionally decomposed into subsystems. Unfortunately, potential reuse of the software for other applications must have been anticipated during development and integrated into the software design. Extensions of the software are difficult and can only be achieved when such extensions were anticipated and designed into the system architecture itself.

In the 1990s, some improvement came with the advent of Object Oriented Systems (OOS). OOS are still hardware dependent topologies, as they are designed for specific hardware configurations and modules are not produced. These systems were based, like their predecessors, on point solutions and are deficient in a number of respects. The point solutions for OOS are derived using Object Oriented Analysis. Extension of the system using existing components was difficult as a result of the multiplicity of languages used.

A prior art interoperable architecture is SCA—Software communication architecture. This architecture is used in such applications as SDR (Software Defined Radio). SCA has specific IDL (Interface Definition Language) interfaces defined for software radios. Any new desired capabilities must fit in to pre defined IDL. SCA provides an interface framework; as such, it is not hardware independent. While peer- upper layer interfaces are well defined in SCA, lower layer interfaces are largely ignored. Another disadvantage of SCA for more general application is its total reliance on CORBA layered communications. Such problems present themselves in CPU overhead and quality of service. Messages can be delivered out of order and processed by different threads when belonging to the same data streams. However, once again, the theoretical benefits have yet to be realized due to a number of underlying factors. In addition, the SCA design does not address the FPGA concerns detailed herein.

In recent years, research has centered on layered or component based systems. In theory, such a system has a thin common layer or component base class that is used in the development of all software modules. Each of the major capabilities of the system is represented by at least one module or component. These modules or components are thus "wrapped" in the thin common layer. Independent components are developed, tested, and packaged independently of each other, and while operating have no knowledge of their environment, since all input/output is constrained to interface ports connected from the outside. Run time discoverable parameter ports control specific behavior. Software components would allow reuse by performing a particular function and providing an appropriate interface with a larger system. Each component would ideally be autonomous regarding its particular functionality. This autonomy would allow changes to be made with individual components without disturbing the configuration of the entire system. Relating the various quasi-autonomous components to each other results in a high degree of complexity in communication and synchronization code.

A system of reusable and flexible components is especially useful for military contractors. In the past, software was designed specifically for a single contract. When a new contract was bid, the contractor stated from scratch. As discussed herein, differences in language and architecture prevented different functionalities from being reused from earlier contracts. Since the software was newly developed there remained a relatively high risk of failure in the software or its interfaces, therefore the new software required testing and debugging, adding to the cost of the contract. The application of a flexible framework of reusable and interchangeable components would enable a designer to leverage earlier development investments and minimize risk of failure in the development process. Contractors would be able to provide clients with more accurate and lower bids and possibly prototypes or catalogues of products easily configured to the clients needs.

The use of object oriented, distributed framework based software systems has led to improvement in the modularization of software, but has increased the complexity of the hardware. The heterogeneity of the distributed computing platform means that the interfaces with field programmable gate arrays (FPGA) and similar devices became increasingly complex. Interfaces between processors eat into valuable computing time and retard calculations. In applications that require real time processing, the general purpose processors are not satisfactory. In addition, the power requirements also become excessive.

In order to achieve real time processing, field programmable gate arrays (FPGAs) are employed. The applications coded in hardware design language (HDL) running on FPGAs achieve orders of magnitude speed improvements over their software counterparts running on general purpose computers. The reconfigurability of the FPGAs provides adaptive processing, and high density FPGAs currently accommodate multiple complex applications running in parallel. But, there are significant problems in integrating multiple applications, which run on FPGAs and boards manufactured by the various manufacturers, into a coherent form.

Distributed processing systems of general purpose or special purpose computers, use a framework of common electrical, physical, and logical interfaces to specify and enforce compatible interfaces between software programs that perform discretely defined processing (components). In a distributed processing system of general purpose or special purpose computers, signal and specialized data processing can consume more processing time and resources than can be provided in a processor. To obtain more processing per volume or per cost the prior art uses specialized digital hardware such as FPGA's, or special purpose integrated circuits. These mechanisms do not provide a common, controllable interface that can interface in a common way to other software-based signal and data processing components in the distributed system. Customarily, large computations of partitionable problems with time constraints are performed using distributed processing.

There is a significant desire for faster and denser FPGA's, particularly in fields such as signal intelligence (SIGINT) that perform front end processing of data from various sensors. The faster the computational algorithms and digital signal processing functions are processed the faster the system can respond. Unfortunately, the core functions are designed and implemented for each specific task without any consideration of code reuse or interoperability between cores or both which results in expensive modification costs when a different FPGA is targeted.

These specialized interfaces may have commonality in terms of physical and electrical interface, but have not been common in terms of logical interface, nor have had the complexity required of modem software based interfaces. These prior mechanisms do not provide a common, controllable interface that can interface in a common way to other software-based signal and data processing components in the distributed system.

The evident reduction in engineering effort and minimization of difficulties associated with the specification, harmonization and enforcement of compatible interface between software programs executing in a network of general-purpose computers suggested the possibility that a similar approach might be taken with computing nodes containing FPGAs, gate arrays, and or special purpose integrated circuits.

A description of the difficulties in the prior art implementation of FPGA boards is described in "From Algorithm to Hardware—The Great Tools Disconnect", from the COTS Journal, October 2001, pages 48–54. A further discussion of alternative designs tried under DARPA is discussed in "VSIPL: Developing Portable Applications for COTS" COTS Journal, October 2001, pages 57–63. In addition, there is a Common Component Architecture (CCA) Forum established by researchers from national labs and academia that are seeking to establish a standard component architecture for high performance computing. The CCA Forum internet site at http://www.cca-forum.org and there are numerous papers, articles and presentation material of general interest.

There are certain board vendors that provide circuit boards with FPGA's, such as those by Annapolis Microsystems, but the implementation has an internal interface scheme that does not provide for a standard interface for other commercial off the shelf (COTS) items.

In summary, while such an approach for interoperability and code reuse is desirable, the implementation has not been successful. Prior efforts have not been successful to structure a framework that allows the apparent benefits of such a system. The integration of hardware design language (HDL) core functions to run on commercial off the shelf (COTS) platforms involving multiple vendors has several pitfalls. For example, the core functions are not written in the same HDL language and may have been coded in VHDL, AHDL or Verilog. The core functions are generally uniquely written for a given FPGA family which makes them chip dependents. The core functions are also generally written for a given COTS or proprietary board, making them board dependent. Finally, the core functions do not have a well-defined interface to facilitate concatenating cores together to design more complex functions.

Clearly what is needed is an interface layer to a core application in order to have reusable HDL cores that are independent of the hardware. There should be some manner in which the cores from various vendors can be mated with a system to allow a 'plug and play' environment and thereby reduce cost and time to market.

BRIEF SUMMARY OF THE INVENTION

The invention is devised in the light of the problems of the prior art described herein. Accordingly it is a general object of the present invention to provide a novel and useful technique that can solve the problems described herein. Thus, an object of the invention is to provide a compatible mechanism for integrating programmable devices in software based frameworks for distributed computers.

Another object is a mechanism for creating a HDL application component independent of the target hardware. A multi-level framework allows the application to be developed independent of the chip or board, and any dependency is built in as part of the framework. Using a shell configuration, a 'wrapper' with a common look, feel and form factor provides the interface between the HDL application and a common and board independent HDL shell, thus isolating the HDL core from any target hardware considerations, and the HDL application and HDL shell together form a component that can be programmed on FPGA and FPGA boards by various vendors. A second wrapper is a board specific HDL shell that interacts with the standardized shell. There is an outer shell that serves to bind the system of such hardware-independent components to an FPGA board and talks to the API layer and to the code layer to the outside world, such as the operating system.

The use of HDL should be understood as also including communications to the FPD or Field Programmable Device, which can also be done directly from object oriented software. Such direct FPD communication is within the scope of the present invention.

The present invention relates to a set of reusable, re-configurable software components that are hardware independent. The implementation of the invention decreases time to market, increases likelihood of task success, and incorporates a configuration management and verification scheme to enable reuse.

The architecture is configured with a common set of functions and a well defined interface that makes integrations and adaptability an easier task. There are a number of components that are deployed within the framework according to a pre-defined plan. In one embodiment the functions are created on reconfigurable logic FPGAs. It should be readily apparent that the present invention is not limited to FPGA devices and any Field-programmable devices (FPDs) are within the scope of the invention., including Simple PLDs (SPLDs) and Complex PLDs (CPLDs).

Software designers generally use visual models, such as data flow/control flow diagrams or object collaboration diagrams to express system behavior in a form that is more easily understood by users and programmers, and used to generate software architecture. Data flow/control flow diagrams used in the context of a specific software modeling method, Common Object Request Broker Architecture (COBRA) are also commonly implemented.

Architecture of the present invention uses a core function, wherein the core function is independent of the architecture. The core function can be any computing function such as algorithms, mathematical functions, signal or image processing functions and so forth. The framework described herein allows components to communicate across platforms and hardware. The functionality is wrapped by a common template wherein the template is pre-defined and interfaces to the function. The template wraps around the core function and as long as the rules governing the template are abided, such as I/O ports and protocols, the core becomes a plug and play element integrated into framework.

The outer shell or component virtual interface (CVI) wraps around the core and provides the resources that any given function requires in order to facilitate the data transformation and processing. There are various engines or modules such as memory interface and communications engines in CVI that allows the cores to function efficiently, wherein the engines can be modules.

The Wrapper drops around the core and creates the hardware-independent component. The component can be anything including a black box that manipulates input data and generates output data to another component or I/O port. The present invention provides a framework to have identical black boxes, regardless of the internal functions, and connect them together to form a system without being bound by the target technology.

Under the framework of the present invention the CVI and core application create the component. A comprehensive system is created from the components and allows for an efficient and flexible use and reuse of core applications allowing redundancy, interoperability and code reuse. Components may communicate with each other through a cross bar.

The system can be designed in order to accomplish some function such as receive signals, processes the signals and outputs the processed signals. For example, for a software radio application, the modulated radio signals have to be received, captured and digitized. The modulation scheme is interrogated in order to demodulate the signals. The decoded signal information signal is then output in the appropriate data form to a speaker. The algorithms that perform the demodulation, filtering and processing can form the core functions that manipulate the data, and be wrapped by the CVI to create components. As part of the processing, the data may be stored and communicated between certain components.

The combination of functions for a certain requirement can be uploaded to a given FPD on a board. When a crossbar is deployed, because the crossbar switching is under software control, it allows various arrangements of the components to accomplish the desired processing. The TPI (Target Platform Interface) crossbar allows for a seamless connection between the various components, and because the components have the same protocol/interface, they allow any arrangement of the system via the components.

A basic rationale for the present invention is that a state of the art system includes various sensors, general purpose computers, reconfigurable computers (RCC) and other devices that communicate to each other and to a network of elements. General purpose computers (GPP) can be used in applications that are not computationally intensive and for which time is not a critical factor. However, for more demanding requirements, FPD's are faster processors and can be easily modified into different configurations. The most practical and efficient design implementations for product development use COTS, wherein various vendors and manufacturers provide different FPD boards and each has somewhat specific implementations for usage.

However in the prior art, the HDL code is usually designed for a given FPGA chip and a given FPGA board. Thus a different FPGA chip or board usually meant a modification of the HDL core.

Still other objects and advantages of the present invention will become readily apparent to those skilled in this art from the following detailed description, wherein we have shown and described only embodiment embodiments of the invention, simply by way of illustration. As will be realized, the invention is capable of other and different embodiments, and its several details are capable of modifications in various obvious respects, all without departing from the invention.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF EMBODIMENTS OF THE INVENTION

A simple embodiment of the present invention is a mechanism for making a component of a HDL application independent of the hardware. One implementation of the present invention is to develop framework where the application is developed independent of the chip or board, and any dependency is built in as part of the framework. The description herein describes one form of Field Programmable Devices (FPDs), namely Field Programmable Gate Arrays (FPGAs) in order to describe one embodiment of the invention. However, the description is equally applicable to other FPDs such as Simple Programmable Logic Devices (SPLDs), and Complex Programmable Logic Devices (CPLDs). Likewise, the use of VHDL as a core application is merely one example of a hardware design language and others are equally permissible within the scope of the invention.

Figure 1A:
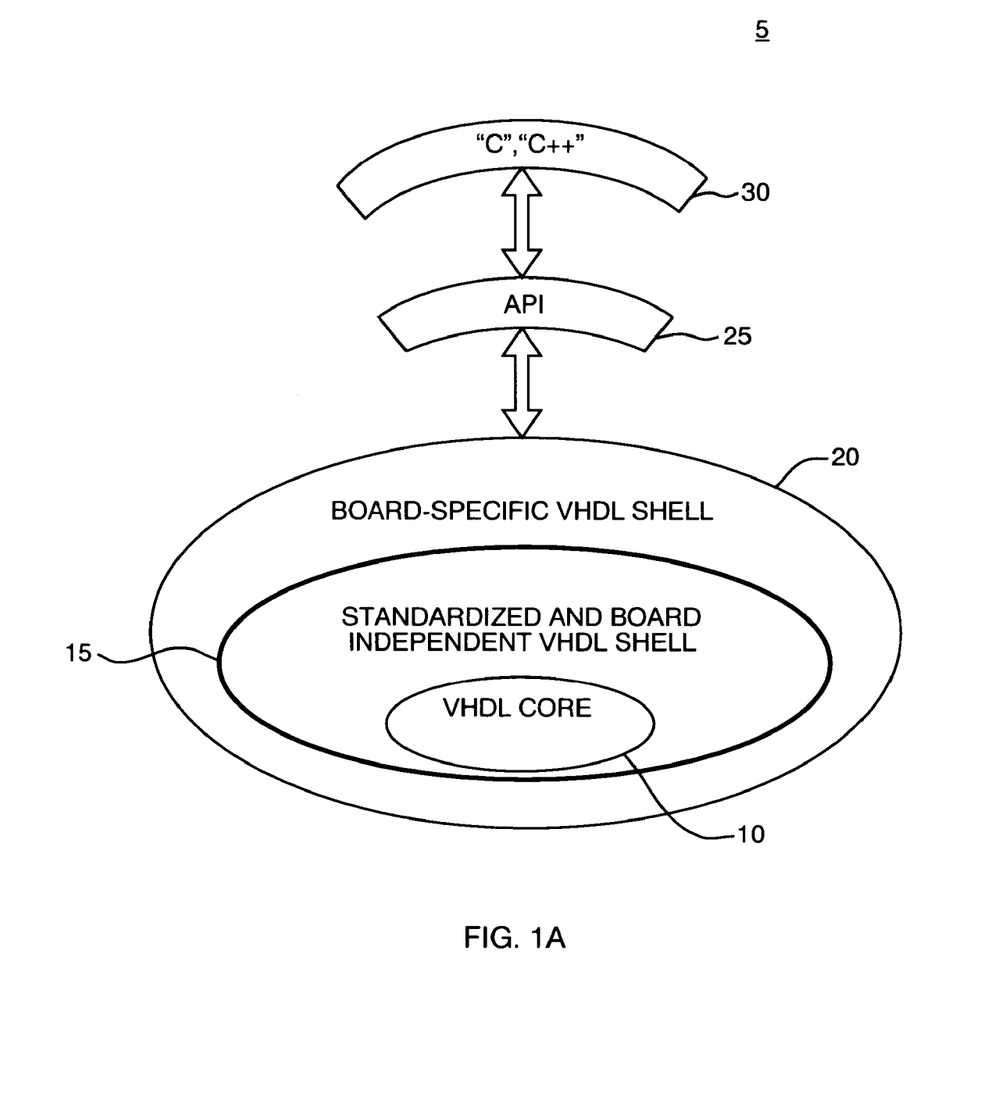
FIG. 1a is a top level perspective of the wrapping of the application HDL with a common hardware-independent shell which is subsequently wrapped by a hardware-specific shell that interfaces with an API and to the outside application programming environment

Referring to FIG. 1a, a top overview is presented, wherein the invention is a framework 5 where the application 10 is developed independent of chip or board. The dependency is built in as part of the framework 5 wherein there are shown multiple layers in a shell configuration. The HDL core application 10, written in a language such as VHDL, is specified independent of the target hardware. A 'wrapper' 15 with a standard look, feel and form factor is a standardized and hardware-independent (board independent and FPD independent) VHDL shell that interfaces with the VHDL application 10. A second wrapper 20 is a board specific VHDL shell that interacts with the standardized shell 15. Looking in from the outside, components that have the same look, feel and form factor, and adhere to the same common interfaces can more readily communicate with each other. The outer shell 20 is board and FPD specific and binds to the target hardware for which it was designed and talks to the API layer 25 and to the operating system via the programming language such as a C, C++ code layer 30 to the outside world. A component development kit (CDK) provides the interface specifications that allow other developers to make compliant components thus promoting interoperability and code reuse. It should be apparent that the coding referenced as C and C++ is not restrictive and any language can be used, either now known or developed.

The goal of the inner shell common VHDL interface (CVI), also known as Component Virtual Interface, layer 15 is to isolate the VHDL core 10 from the target platform specifications that are board and FPD specific. This is accomplished by defining a common VHDL interface or shell 15 around the VHDL core 10 to form a hardware-independent Component 17 and to isolate it from the target platform specifications. The VHDL core 10 and the CVI 15 are thus hardware independent elements. The target specific outer shell or target platform interface (TPI) 20 is used to bind the hardware independent components 17, each comprising a CVI and a VHDL core, to a given hardware (not shown).

Figure 1B:
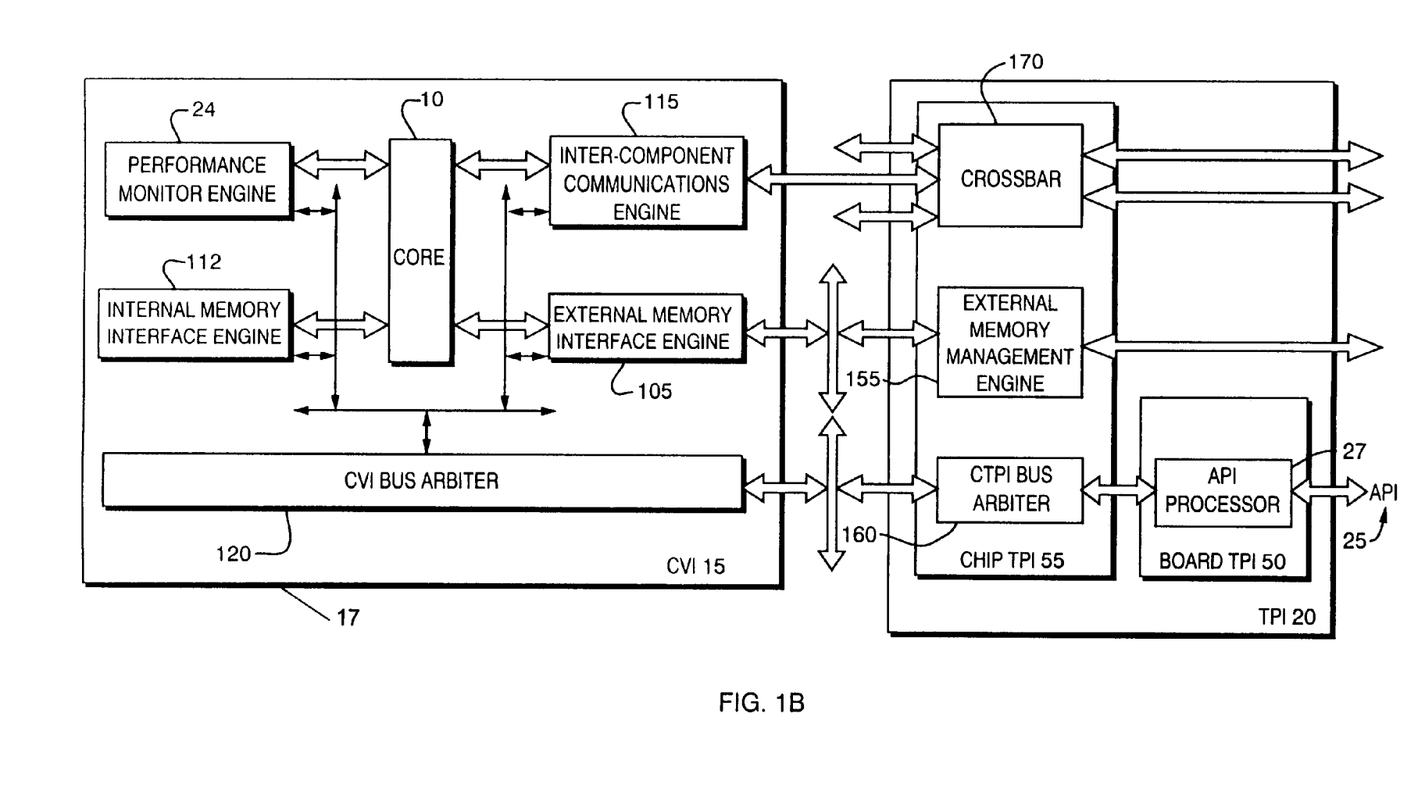
FIG. 1b is a top level functional diagrammatic perspective of the coupling of the application HDL with a common hardware-independent shell (CVI) which is subsequently wrapped by a hardware-specific shell (TPI) that interfaces with an API and to the outside application programming environment

A functional overview presentation of the interface of the elements of the present architecture are presented in FIG. 1b, which shows the application core software 10 that interfaces with the CVI board independent shell 15. The board dependent TPI interface 20 couples between the CVI 15 and the API 25 via an API Processor interface 27. The API 25 is the layer between the TPI 20 and the code layer 30 that links to the operating system of the user.

The basic framework 5 has a core 10 and component interface (CVI) 15 and target specific interfaces (TPI) 20. A component 17 is comprised of the core 10 and CVI 15. The component 17 is independent of the target FPGA board and has identical I/O specifications and protocols as part of the standardization. The CVI 15 is identical for all cores and contains basic support engines that any given core 10 requires. While the CVI 15 is a hardware-independent shell, the TPI 20 is written specifically for a given FPGA board and contains all the hardware-specific information for the board assets such as memory, clocks, and FPGA pin designations. The same TPI 20 can be used for all components that run on that specific FGPA board. The TPI 20 has two basic blocks, a chip TPI 55 and a board TPI 50, wherein the chip TPI 55 is instantiated on every FGPA chip on the target FPGA board. The board TPI 50 is instantiated once per FPGA board and is physically located on the FPGA board that communicates to the board system bus. There is a well defined interface connecting the CVI 15 and TPI 20 that allows for efficient communication exchange.

Some of the functional aspects of the CVI 15 are shown along with the interconnections, such as the CVI bus arbiter 120; inter-component communications engine 115 also called a data flow I/O management engine; the internal memory interface engine 112 and the external memory interface engine 105. The CVI 15 is a hardware independent shell that wraps the core and provides a level of abstraction from the external environment. The CVI provides virtual assets such as memory management and communications that gives the core designer a degree of freedom as the core application needs no knowledge of assets external to itself. Therefore, the designer only has to focus on the function rather than the interface and memory, other cores or the system bus. However, the core must abide by a pre-determined set of I/O ports present in a template that is mapped as the core application interface. These CVI functional blocks are described in further detail herein.

Auxiliary functions are also within the scope of the present invention such as the performance monitor 24. The performance monitor module 24 checks the health of portions of the hardware and in the event of a failure the same function can be instantiated by another component without interruption, thereby providing redundancy. Another auxiliary function is power management that can be incorporated to decrease non-essential certain core functionality in order to manage power. Certain functions that are not needed for a given core are shutdown to increase power longevity, especially when the power source is limited.

The interrelationship between the CVI 15 and the TPI 20 is depicted, wherein the TPI is subdivided into a chip TPI 55 and a board TPI 50. The functionality of the TPI 20 includes the scaleable crossbar 170; an external memory management engine 155; and chip TPI (CTPI) bus arbiter 160 and an API processor 27.

While the component itself is independent of the target hardware, operating system and platform, it is still necessary to run the functions on some given hardware and knowledge about the hardware is needed. The general structure of a FPGA board is well known to typically have a bus interface, bus controller, clocking, memory, and data connection, among other resources. Boards incorporate some form of dependency into the FPGA and require complex integration to mate and communicate with the overall system and other various FPGA's. The chip TPI 55 is specific to the FPGA chips on the board, wherein the chip can be from any of the manufacturers such as Xilinx or Altera, having different gate densities and different I/O counts, and different internal architectures. In general terms, the chip TPI 55 binds to the specific on-chip resources, such as built-in clock management resources some FPGAs have, essentially making the components independent from the chip specific details. There is also a board TPI 50 that binds to a board's system bus (such as PCI or VME) and other on-board assets such as analog-digital converters, essentially making the components independent from the board specific details.

Figure 2:
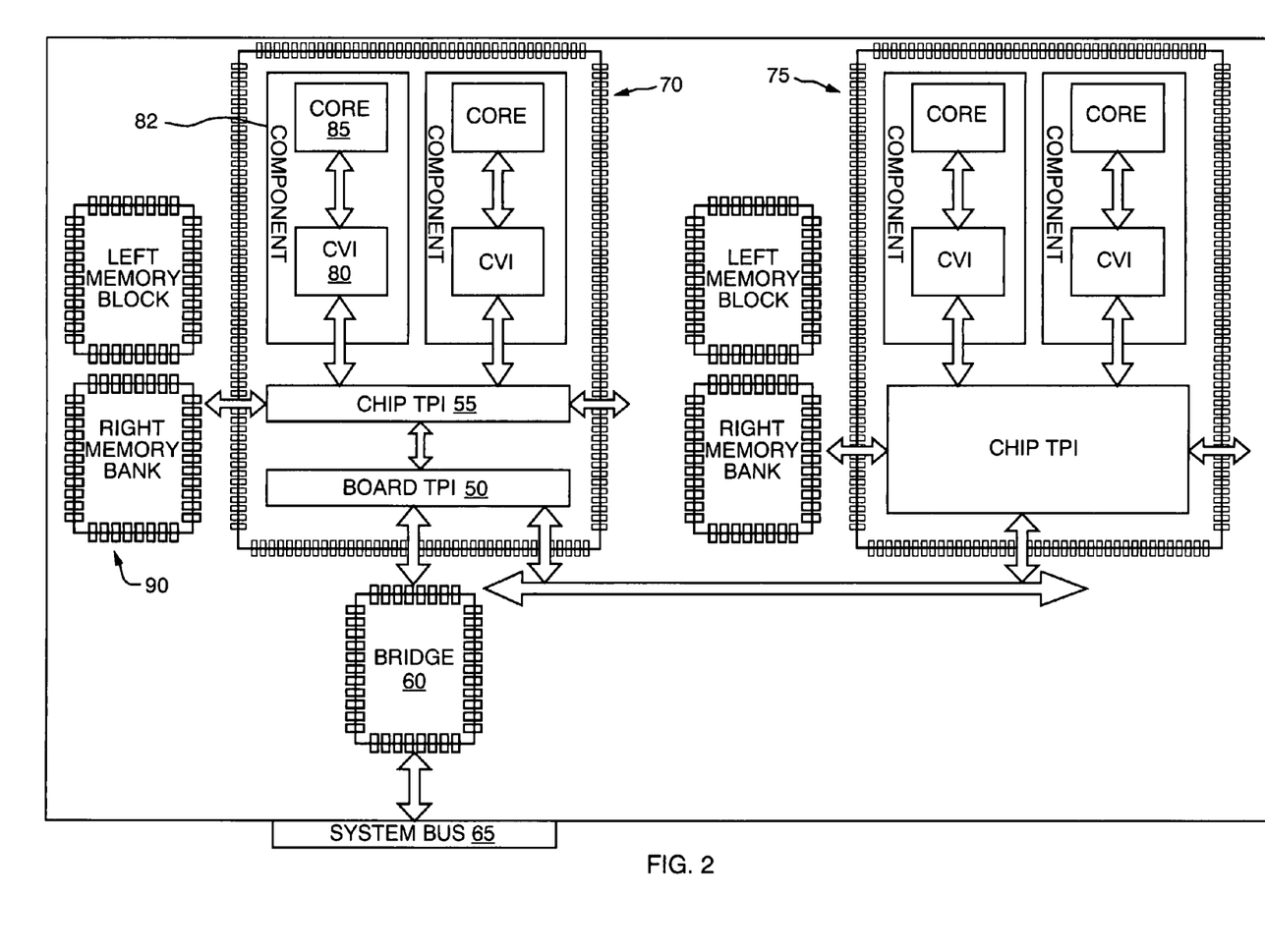
FIG. 2 shows a presentation of a board with two FPGA devices and the interconnections and elemental breakdown of the devices

A top level diagrammatic perspective of the architecture is shown in FIG. 2 showing two components 82 for each of two chips 70, 75 on a single board 40. It should be understood that there can be many components on a chip and many chips on a board. In this embodiment, the board 40 has two FPGA chips 70, 75 with a 'master' chip 70 having the board TPI 50 that interfaces to the bridge 60 and the system bus 65. Bridge 60 essentially provides a global bus interface.

While there is only one board TPI 50 per board, every chip has a chip TPI 55. Chip TPI 55 manages these resources and also couples to the other chips 75 through crossbar switch (not shown). As shown, there is a single board TPI 50 per board, residing on the master FPGA, while all other FPGA's are termed slaves. The master chip 70 provides the outside interface to the system bus 65. The slave chips communicate from the chip TPI 55 to other slave units and to the master chip 70, and there is a communications channel from the chip TPI 55 of the slave chips to the board TPI 50 of the master chip 70 that provides interface from slave chips to the system bus 65.

The dual TPI approach allows for improved communications to the operating system as opposed to all the chips communicating directly with the operating system. The chip with the board TPI 50 is the master chip with respect to communication with the operating system. The chip TPI 55 manages the resources of a single chip and acts to bind the CVI 80 to the FPGA's physical I/O and external memory 90. It enables different components, whether on or off chip, to pass data to each other via switching mechanisms. And, the chip TPI 55 provides the interface to the board TPI 50. The external right and left memory banks 90 for each chip, is the standard in the industry and is a well known implementation. There is a left and right data bus and a left and right state machine to handle memory requirements from components. And, there is arbitration to handle the requests from multiple requests from multiple components. Note that the CTPI is not limited to two memory banks.

Figure 3:
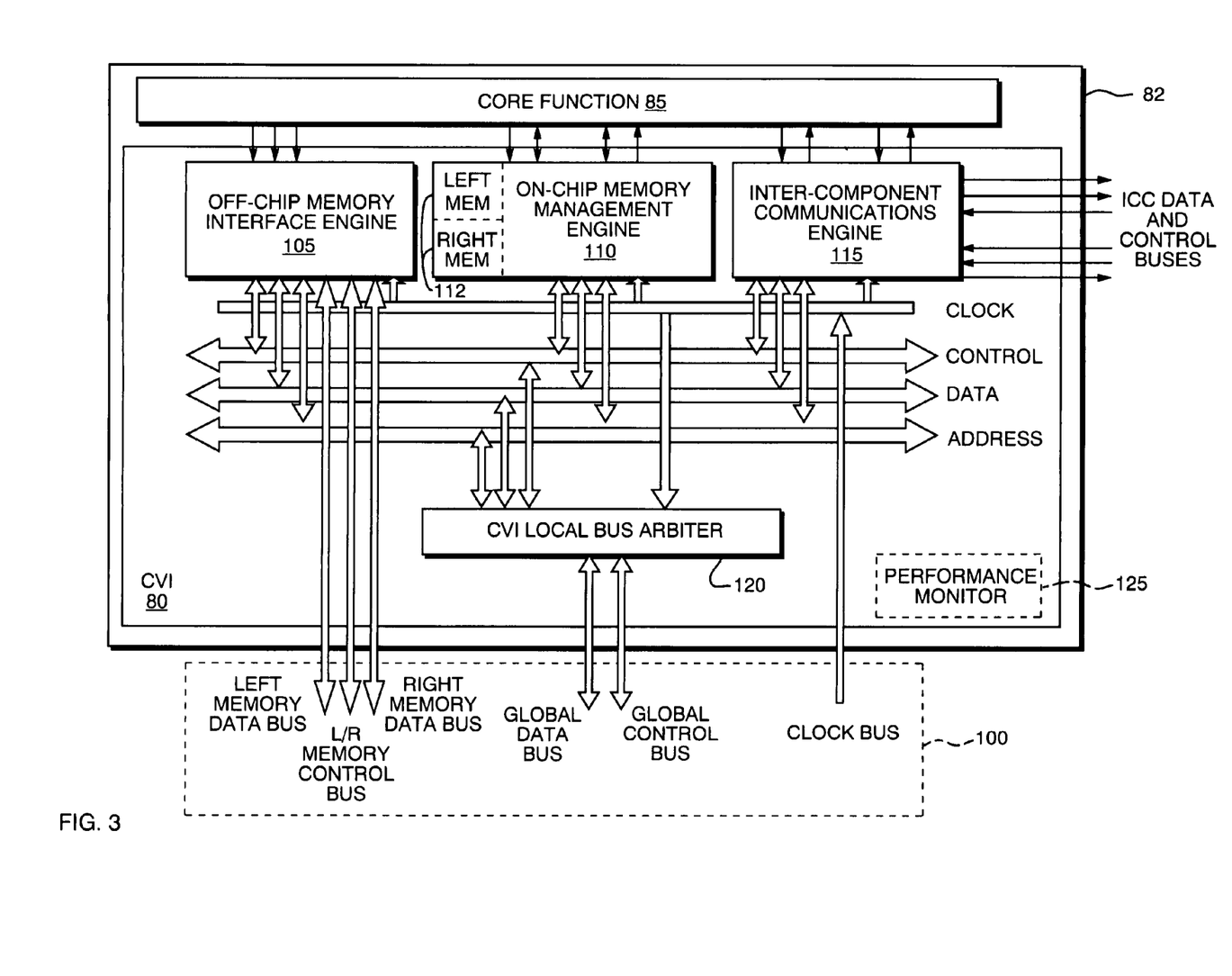
FIG. 3 is s block diagram showing elements and the interconnectivity between the elements of the CVI

The CVI block diagram in shown in further detail in FIG. 3, omitting the chip TPI and board TPI elements, wherein the CVI 80 isolates the VHDL core 85 from the TPI (not shown). The CVI 80 is the buffer between the generic VHDL core function 85 and the more board specific TPI interface (not shown).

It should be understood that a component 82 is essentially the integration of the VHDL core function 85 of an application with the CVI 80. The application 85 itself is not a component 82 and neither is the CVI 80 itself, but rather the integration of these elements creates a component 82. The component 82 is modular and unaware of other components or its environment. The component 82 implements function, accepts input, and produces output. The components are controllable by runtime parameters and allow an adaptable and maintainable structure and standardized interfacing. In this manner, the components have added reusability and are easily combined with other components to permit varied requirements and redundancy as well as interoperability and code reuse.

The CVI 80 takes care of memory and virtual I/O communications requirements of the core 85 via dedicated engines, such as the inter-component communications engine 115, bus arbitration engine 120, on-chip (local) memory engine 110 and the off-chip/shared memory engine 105. CVI 80 provides certain functionality necessary to all applications, such as input and output data ports and protocol. The data can be communicated internally to other components or externally to the operating system. In the preferred embodiment, each of the engines has a unique address. The communications between components is accommodated via the inter-component communications engine 115 using a common protocol along well-defined data ports or buses in the same language.

Core functions 85 can require memory, internally, externally or both, and the on-chip (local) memory engine 110 manages the access to on-chip memory dedicated to the core function. Some algorithms require some small memory that can be provided on-chip as well as larger memory requirements that require off-chip memory. Thus, an on-chip memory engine 110 is used for smaller memory requirements while larger memory requirements are handled by the off-chip memory engine 105. In one embodiment of an FPGA board there may be left and right memory sections 112 within the on-chip memory engine 110 to accommodate requirement for two independent memory spaces. More independent more memory spaces can be accommodated as well. The internal memory banks 112 may be configured in a similar fashion and purpose as the common memory banks 90 in a left/right fashion and used in conjunction with the CVI memory interface engines 105, 110. They allow for internal memory storage on the chip for smaller memory tasks and are parametrically reconfigurable in width and depth to meet the core requirements. In addition, if not required, each memory block can be placed into a power save mode.

In one embodiment, the addressing modes of the on-chip memory engine 110 supports both directed and automatic modes. Directed mode is when all addresses are created by the core and transmitted to the memory through the address bus. In the automatic mode the memory engine 110 generates the required memory address.

Larger memory requirements would still be handled by the external memory banks 90 and communicated through the CVI external memory engine 155. The external memory engine bridges the core external memory access requests to the external memory management engine on the TPI Chip (not shown). The external memory 155 also supports the directed and automatic addressing modes.

There is one CVI with multiple engines in it, therefore requiring some type of address management, which is performed by the CVI bus arbiter 120, also called CVI standard interface module. The CVI bus arbiter 120 is the interface between the CVI Bus and the chip level TPI Bus (CTPI) and makes internal CVI engines accessible to the operating system (OS). The Chip TPI (not shown) encodes the CVI engine addresses and their respective registers in the address/data bus and the CVI bus arbiter 120 extracts the address and places it on the internal address buses.

Within the CVI bus arbiter 120 are registers that store various operating data characteristics, including status registers. Once a component is developed, it is assigned a unique part number termed the component identification number. The identification number and various configuration management data is then associated to the identification number. The component identification number allows accessibility from the operating system to monitor status, health, and to effect the operational characteristics such as power save. The identification number is also used for communication with the Chip TPI (not shown).

In general, the data flow within the various structures adheres to the Harvard Architecture that defines multiple parallel busses allowing multiple paths for communications for the internal data and address busses.

The inter-component communications engine 115 controls the flow of data between different components whether on the same FGPA chip or on another chip. This allows an application to pass data to another component without needing to know the exact communication mechanism. A crossbar switch on the Chip TPI (not shown) does the actual connection, although components may be connected to each other directly. There are several protocol options including serial and parallel for the component communications. Components can communicate via various supported protocols, and in particular, serial communications is one of the preferred modes, especially for components on different FPGAs. The data flow of the inter-component communications engine 115 for one embodiment uses a subset of FPDP for components on the same FPGA, but the protocol can be TCP/IP or any other communications scheme. The data exchange between components can be achieved via the TPI crossbar (not shown) with or without FIFO's in the path or through the external memory depending upon the mode selected and the resources.

A performance monitor 125 provides fault tolerance mechanisms to monitor health of the elements. Prior art performance monitors essentially have status indications to check the integrity of the various components, and polling in a round robin fashion or interrupt scheme as is known in the art.

Figure 4:
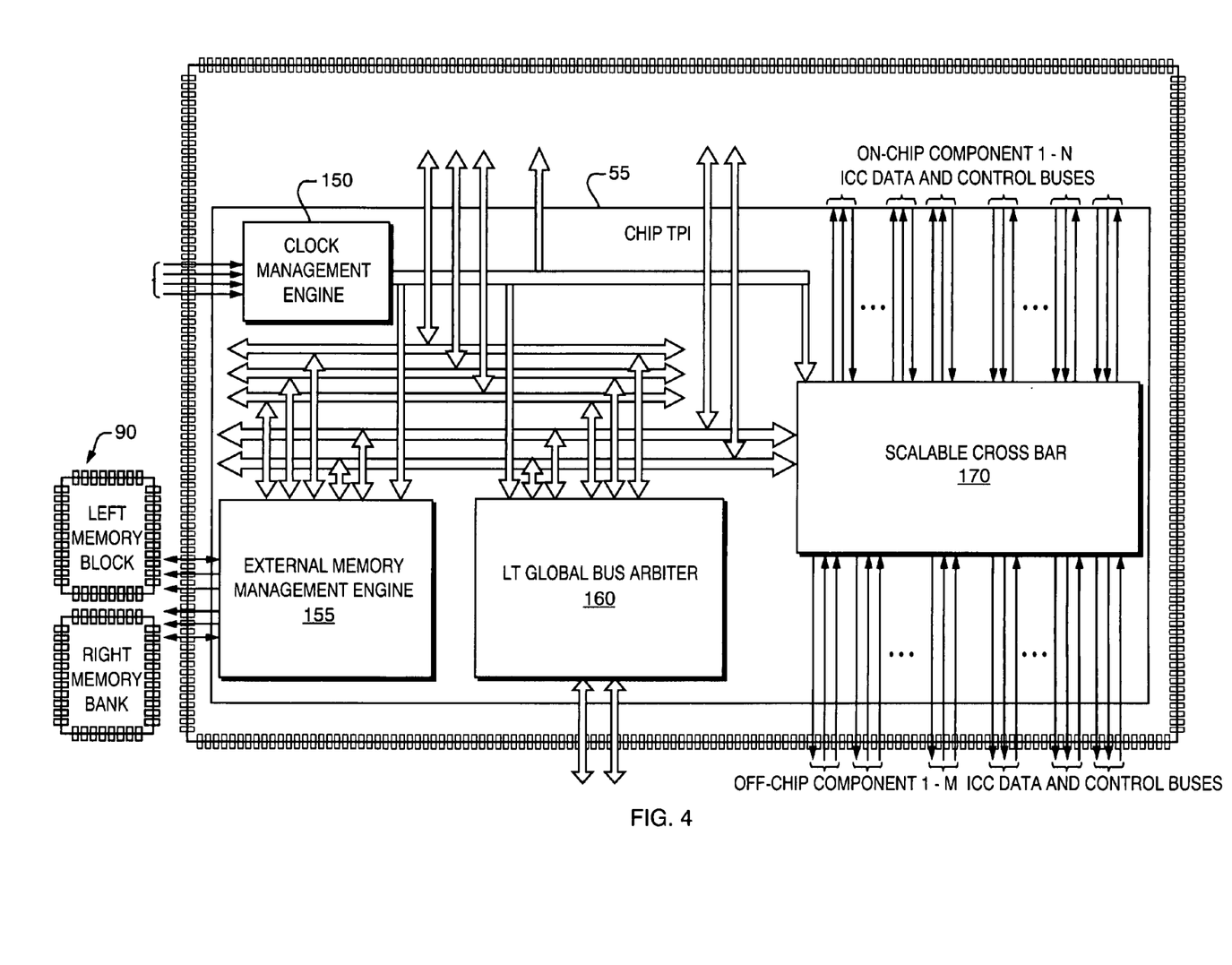
FIG. 4 is a block diagram showing the elements and connections for the chip TPI

The chip TPI is detailed in the block diagram of FIG. 4 that serves to bind the component to the FPGA's physical I/O and memory and interfaces to the board TPI 50. This allows different components, whether on or off chip, to pass data to each other via the crossbar 170. The Chip TPI is essentially the glue that binds the hardware independent components to the FPGA and provides the physical connection to external memory, other components, and a board level TPI 50 interface. There is an arbiter 160, a crossbar 170 to manage connectivity/communication between any components and to other components, including broadcast/unicast communications, an external memory management unit 155, and a clock management engine 150.

The external memory management engine 155 controls the left and right memory blocks 90 of the FPGA. The external memory engine 155 arbitrates among the components requiring the external memory resources 90 by intelligently allocating and concurrently managing the requests and the memory banks 90. Thus a component can use the memory as a swap space for retrieval by other components. The banks 90 are independently managed and are also accessible from the operating system for both read and write functions. The memory can therefore also be used by other software applications running on a general purpose processor that work in conjunction with the RCC. The memory engine supports directed or automatic addressing modes, and there is a Chip TPI external memory bus common to all components allowing accessibility. There may be several global clock buffer signals available to the external memory management engine 155 either directly or via digital clock managers.

In one embodiment, the external memory management engine 155 allocates memory for each component and assigns address offsets to each one under the operating system. It also supports direct memory access (DMA) by applications running on the general purpose processors. As a component writes to the external memory, an event monitor captures the write operation along with the pertinent identification data and beginning and ending address pointers of the data. A notification signal is generated and the destination (another component or another application) waiting for data retrieves the data and frees up the memory space. The same mechanism can be used to pass data from a software application to a component.

TPI whether chip or board is written only once for a given board because it specifically assigns resources of that board. The CTPI bus arbiter 160 performs a different level of arbitration than the CVI bus arbiter of FIG. 3, and manages communications between the board TPI 50 and the chip TPI 55, thereby providing the interface to the operating system.

The clock management engine 150 or global clock distribution engine includes a clock bus necessary for distributing clocks between the components and other engines on the chip in order to allow syncing and timing of processing and communications. The clock engine 150 accepts global clock signals from input I/O pins and distributes them through the chip. A buffered clock input can be processed by clock phase management devices as is known in the art. A local clock is distributed on the local bus to be used by the TPI and other components. Depending upon the clock network and phase management implementations of the FPGA, clock multiplication/division, phase changing, and clock multiplexing may be permitted in such a manner that various clocking can be utilized.

The scaleable CTPI cross bar switch 170 establishes the point to point full duplex path between one or more components, and can also be used to establish broadcast messaging by connecting to all components, whether on-chip or off-chip. The crossbar 170 is scalable and communicates in parallel or serial fashion or a combination such as internal component communications in parallel with external communications done in serial, with appropriate parallel/serial converters. The number of I/O ports available to the switch 170 depends upon the architecture of the board, and can connect to on-chip ICC engines of the components or external chip pins that communicate with crossbars on other FPGA's. In the serial format, the data is clocked at some multiple of the clock speed. Crossbar switches are known in the prior art, such as those used by the manufacturer Annapolis Microsystems in their board configurations.

There is one TPI and multiple components, therefore requiring some type of arbitration, which is performed by the CTPI bus arbiter 160. The CTPI bus arbiter 160 is the interface to the board TPI data bus and the CTPI bus. It also passes event notifications from the CTPI memory engine to the BTPI.

The components, the chips and the boards all are recognizable in the system by their addresses and knowledge of their functions is embedded in the software applications exploiting them. This allows the system to communicate with the board as described herein.

Figure 5:
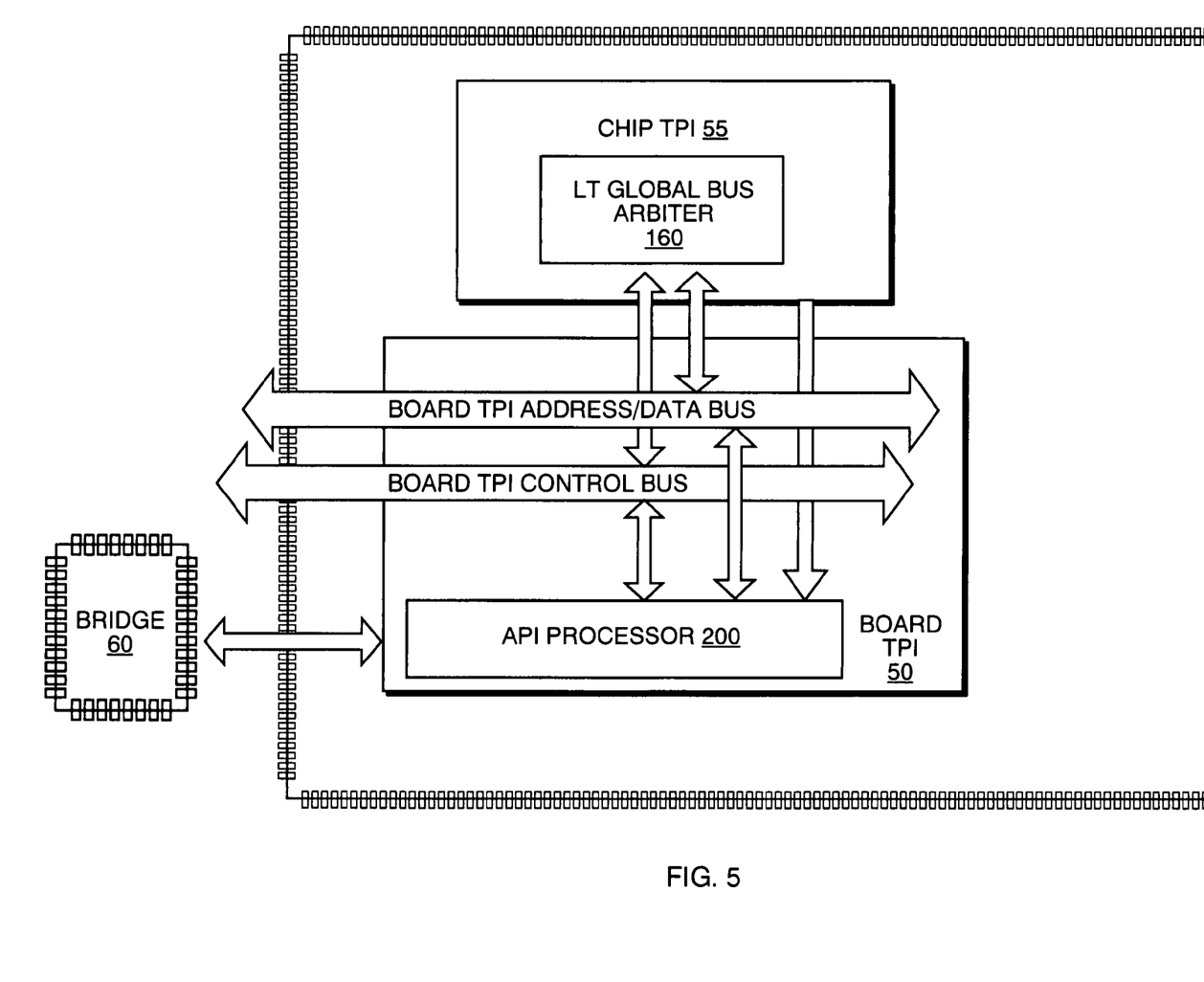
FIG. 5 illustrates the board TPI structure and connections

Referring to FIG. 5, the board TPI 50 provides access to the operating system via the bridge 60 and system bus thereby allowing dynamic control of the various chips by the operating system through the chip TPI. The API Processor has several functions, namely performing a boot-up discovery of available components after configuration; bridging from the operating system to the components via the CTPI bus; and notifying the operating system of events. Board TPI 50 or BTPI acts as a bridge between the software API and the CTPI and there is one BTPI per board on an FPGA which is coupled to the Bridge Chip which is the board's main interface to the system bus. The BTPI facilitates communications between the component and the API while also notifying the API of event status in the external memories. The BTPI has a boot-up function that maps the location of the components to facilitate the communication data flow.

The BTPI 50 incorporates the API processor 200. The API processor 200 talks to the bridge 60 and generates TPI global data bus and TPI global control bus that goes to the chip TPI and also other chips. The bridge 60 provides the interface to from the system bus to the various FPGA's. The API processor 200 is board specific developed separately for each board and requires certain information, such as chip I/O and resources around each chip, and specific handshake details of the Bridge chip bridging the board to the backplane such as PCI or VME. The BTPI off-chip signals are specifically defined for each board with pin mapping for different FPGA boards.

Figure 6A:
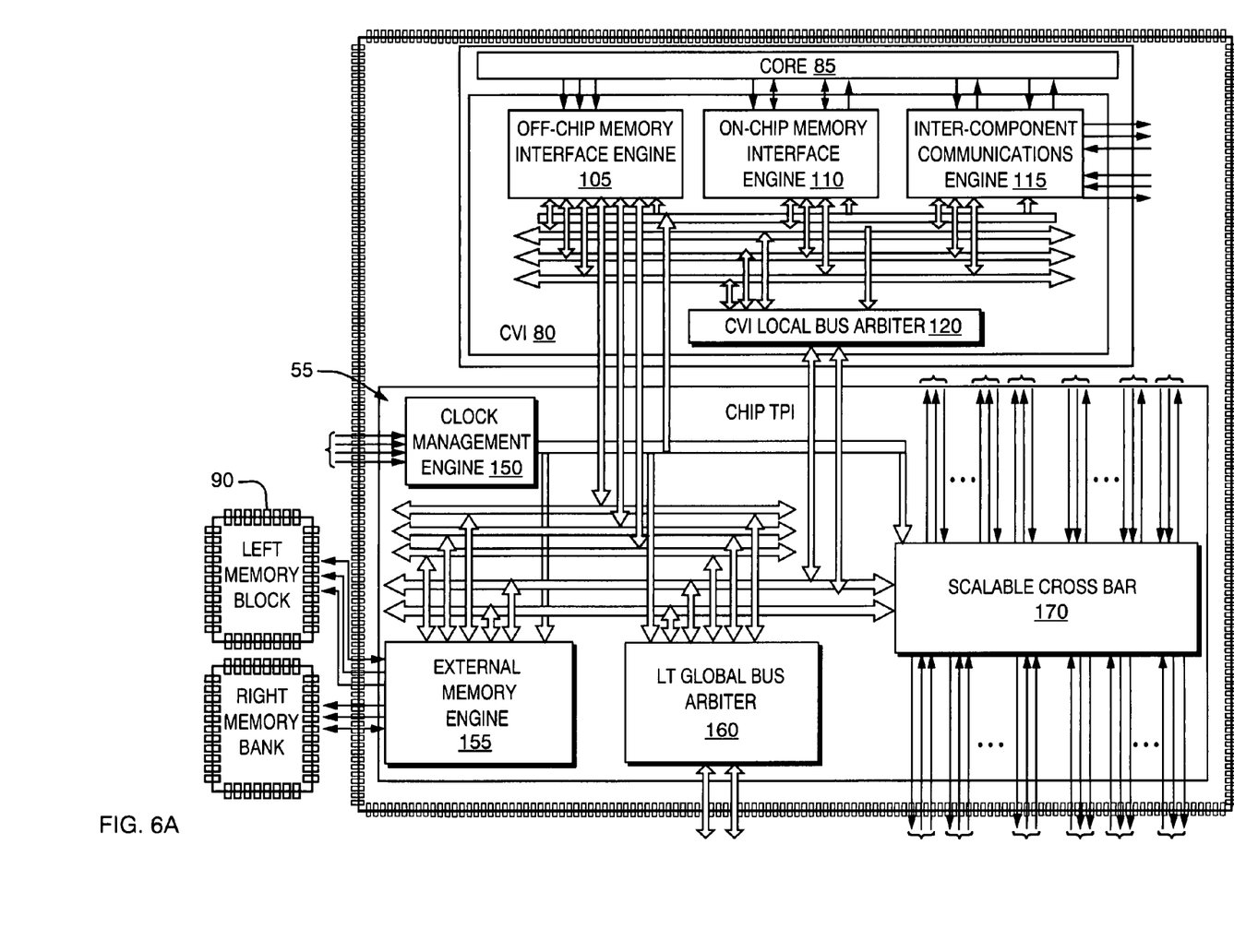
FIGS. 6a and 6b show the overall detailed structure of the board including the two FPGA chips and the connections between the elements, the FPGA's and the outside environment
Figure 6B:
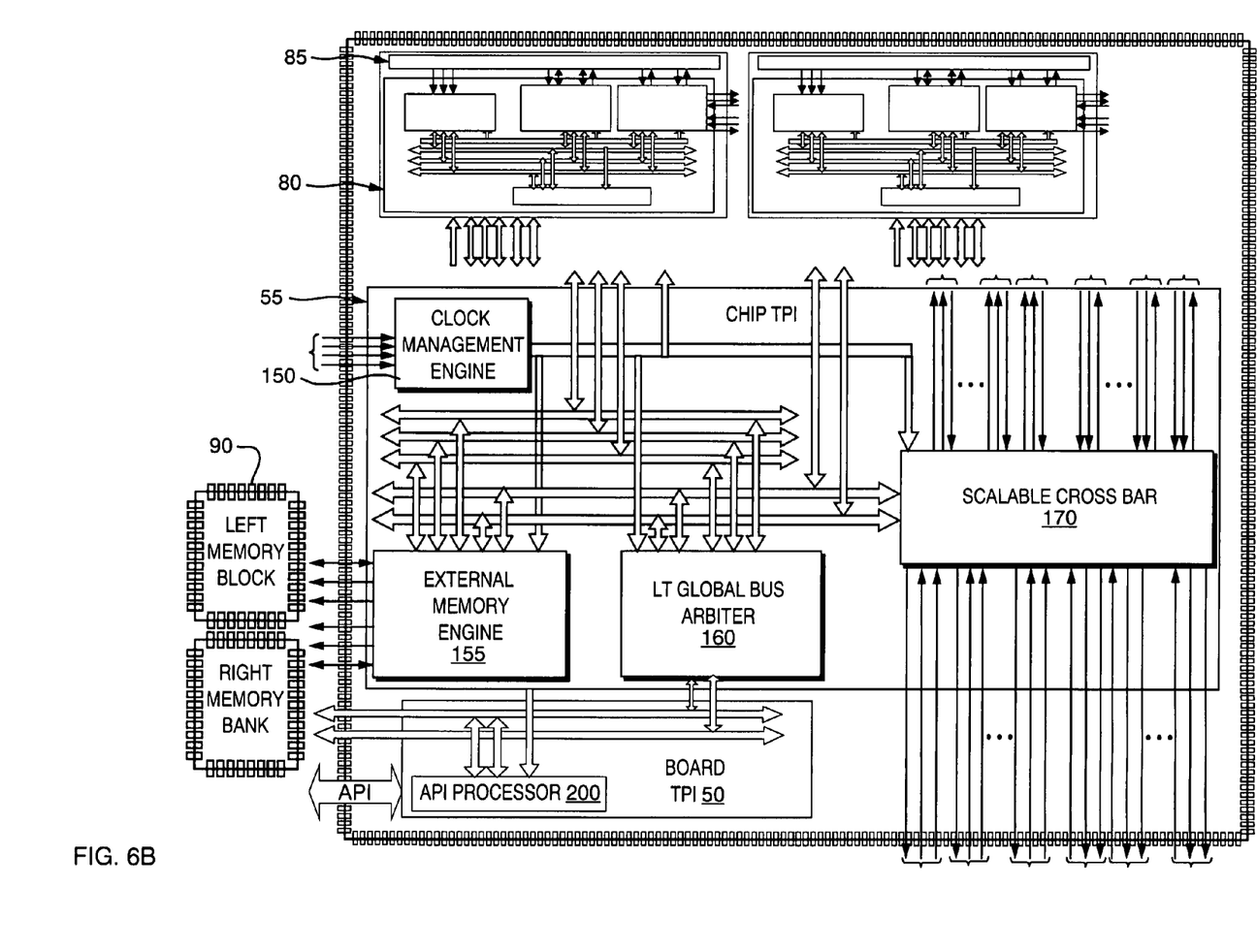

The architecture details combining the elements discussed herein are presented in full view in FIGS. 6a and 6b. The architecture of the present invention is built on the concept of making a component with a core application independent of the hardware, and some of the basic block elements include the VHDL Core 85, CVI 80, Chip TPI 55, Board TPI 50 and the elements therein as described, along with the various communications links. Thus, while the TPI is board specific, when a new board is introduced, it is only necessary to alter the TPI. The application has no binding to the physical chip assets and CVI also has no knowledge of the chip resources, as it is only the chip TPI that has knowledge of the physical resources of the chip. The board TPI 50 then allows the rest of the system to utilize the resources of the chip.

The VHDL process in developing a component is known to those skilled in the art. The process for taking an application and incorporating into the component VHDL library commences in two ways depending upon whether it is a new core or modifying an existing core. For an existing core, the application source code is modified to conform to the I/O standard and parameters of the invention. For a new core, the application source code is written in conformity with the I/O standards of the component system that is laid out in the Component Design Kit (CDK). Thus anyone can draft cores that would be accommodated by the system as long as the I/O standard is followed. The core is combined with the CVI to generate the component that is subsequently stored in the Component Library. The reference to the 'library' is a software conception that designates a file system.

With respect to the VHDL processing, the compilation processes are well known in the art. The first step is to modify the I/O of an existing VHDL core, or design a new VHDL core, to be compatible with the I/O of the present invention. The next step is to provide the CVI interface to produce the component itself, which is added to the component VHDL library. The FPGA board specifications are used in conjunction with the TPI development to provide the outer shell interface, which is stored in the TPI VHDL library.

For a given FPGA board, a TPI integration plan is developed that allows boards from any manufacturers to be used by the components in the component VHDL library. The specifications of the board are used to provide the interface mechanism and the results in a board TPI that is compatible with the architecture and framework of this invention, and the TPI interface is stored in a TPI VHDL library.

The bitstream generation process is well known to those skilled in the art. In the case without partial reconfiguration, the selected component from the Component Library is integrated with the corresponding TPI from TPI VHDL library. The bitstream is generated following synthesis and the appropriate FPGA is uploaded.

Bitstream generation without partial reconfiguration is detailed in the prior art. Several VHDL components, that the user wants to download to the board for a specific application are selected from the component VHDL library. The components are combined with the TPI VHDL for the board on which the components are intended to run in order to generate the bitstream that can be uploaded to the FPGA.

Partial reconfiguration is an approach to programming FPGA's that is faster than the full reconfiguration. Bitstreams of different components can be loaded at different times onto the FPGAs.

The end result after development is a VHDL component, a chip with standard interfaces and input/output (I/O) wherein the controller has defined pins that may or may not be used depending upon the application. As there is a parametric interface there is a mechanism wherein the TPI maps to the I/O pins either hard-wired or parametrically through a pin association mapping.

There are various boards from different manufacturers and components are integrated into the present invention architecture with partial reconfiguration. With respect to Library Creation, a board such as a WILDSTAR FPGA (TPI A) from Annapolis Microsystems or Chameleon from CRI (TPI B) is processed to generate an individual BitGen for each component. The TPI bitstream for that board is created and stored in the TPI library. For a component VHDL, an individual BitGen is created for each board and the component bitstream for each board is stored in the component library. The mission can be a related mission or complimentary mission, however it can also be an entirely unrelated mission. Using the stored TPI library, the TPI Bitstream for the COTS board is combined with the component bitstream to produce the FPGA upload and configuration. Various missions can be commenced using the component bitstream alone or in combination with another board.

A comprehensive application manager monitoring the components and resources via a high-level architecture is described in the commonly assigned application entitled "OBSERVATION TOOL FOR SIGNAL PROCESSING COMPONENTS" application Ser. No. 10/290,939 filed on Nov. 8, 2002. This invention describes elements such as applications, tasks, components and framework interconnected to each other and details a framework that integrates the reconfigurable boards into a functional architecture. In one embodiment of the invention described therein, software components are developed and placed in a software library for general purpose processor boards in parallel with the reconfigurable computing components of the present invention. The developer can then pick and choose the software functions from the GPP library or the RCC library depending upon the overall system requirements such as size, weight, power and performance.

Numerous characteristics and advantages have been set forth in the foregoing description, together with details of structures and functions of the present invention, and some of the novel features thereof are pointed out in appended claims. The disclosure, however, is illustrative only, and changes may be made in arrangement and details, within the principle of the invention, to the full extent indicated by the broad general meaning of the terms in which the appended claims are expressed.

The objects and advantages of the invention may be further realized and attained by means of the instrumentalities and combinations particularly pointed out in the appended claims. Accordingly, the drawing and description are to be regarded as illustrative in nature, and not as restrictive.

The foregoing description of the embodiments of the invention has been presented for the purposes of illustration and description. It is not intended to be exhaustive or to limit the invention to the precise form disclosed. Many modifications and variations are possible in light of this disclosure.

It is intended that the scope of the invention be limited not by this detailed description, but rather by the claims appended hereto.

What is claimed is:

1. An architecture for a field programmable device (FPD) on a circuit board, comprising:
   at least one hardware design language (HDL) application core;
   at least one common shell wrapping said HDL core and forming at least one component, wherein said common shell has a plurality of pre-defined interfaces for communicating with said core, and wherein said component is hardware independent of said FPD and said circuit board;
   a board specific target shell coupled to said common shell wherein said target shell incorporates FPD specific information and board specific information; and
   an application program interface (API) coupled to said target shell and communicating with an operating system.

2. The architecture for a field programmable device (FPD) according to claim 1, wherein a plurality of FPDs are coupled together on said board, and wherein said API communicates with a single target shell.

3. The architecture for a field programmable device (FPD) according to claim 1, wherein a plurality of components are coupled to said board target specific shell.

4. The architecture for a field programmable device (FPD) according to claim 1, wherein said HDL core is written in a hardware description language from at least one of the group consisting of: Very High Speed Integrated Circuit Hardware Design Language (VHDL), Altera ® hardware design language (AHDL) and Verilog.

5. The architecture for a field programmable device (FPD) according to claim 1, wherein said FPD is selected from at least one of the group consisting of: field programmable gate arrays (FPGAs), Simple Programmable Logic Devices (SPLDs), and Complex Programmable Logic Devices (CPLDs).

6. A multi-level framework for development of applications on a field programmable device (FPD) that allows an application to be developed independent of hardware elements, with dependency built into the framework, comprising:
   at least one component, wherein each said component is comprised of at least one core application and a respective component interface layer, wherein said core and said component interface layer are hardware independent elements, and wherein said component interface layer has a plurality of pre-determined interfaces;
   a target platform interface interacting with said component, wherein said target platform interface is FPD specific and board specific and binds said component interface layer and said core application to said FPD and a board; and
   an application program interface (API) coupled to said target platform interface providing an interface to an external operating system.

7. The multi-level framework according to claim 6, wherein said component further comprises a bus arbiter, an inter-component communications engine, an internal memory interface engine and an external memory interface engine.

8. The multi-level framework according to claim 6, further comprising a performance monitor.

9. The multi-level framework according to claim 6, wherein said target platform interface is divided into a chip target platform interface and a board target platform interface.

10. The multi-level framework according to claim 9, wherein said chip target platform interface comprises an arbiter, a crossbar switch, an external memory management engine, and a clock management engine.

11. The multi-level framework according to claim 10, wherein said crossbar switch is a scaleable and provide a point to point full duplex path between one or more components.

12. The multi-level framework according to claim 9, wherein said board target platform interface comprises an application program interface processor.

13. The multi-level framework according to claim 6, wherein said at least one application core is an object oriented software module.

14. The multi-level framework according to claim 6, wherein said at least one application core is a hardware description language application.

15. The multi-level framework according to claim 6, further comprising at least one additional field programmable device coupled to a board, wherein a single API communicates with said external operating system.

16. A method for integrating programmable devices in a frameworks for distributed computing wherein a core application is developed independent of a chip or a board with dependency built in as part of the framework, comprising:
   wrapping a common shell around at least one said core application thereby creating a component, wherein said common shell has a pre-defined interface and is board independent and chip independent;
   designing a target platform shell for a specific board and wrapping said target platform around at least one said common shell wherein said target platform binds said common shell and said core application to said board; and
   providing a bridge between said target platform shell and an external operating system.

17. The method for integrating programmable devices according to claim 16, further comprising the step of providing memory assets.

18. The method for integrating programmable devices according to claim 16, further comprising the step of common resource arbitration.

19. The method for integrating programmable devices according to claim 16, further comprising managing power of said component and/or said target platform interface shell.

20. The method for integrating programmable devices according to claim 16, further comprising monitoring performance of said component and/or said target platform interface shell.

* * * * *